United States Patent
Shimazu et al.

(10) Patent No.: US 6,187,510 B1
(45) Date of Patent: Feb. 13, 2001

(54) DIGITAL LITHOGRAPHIC PRINTING PLATE AND METHOD OF MAKING THEREOF

(75) Inventors: Ken-Ichi Shimazu, Briarcliff Manor; Suck-Ju Hong, Bronxville, both of NY (US)

(73) Assignee: Kodak Polychrome Graphics LLC, Norwalk, CT (US)

( * ) Notice: Under 35 U.S.C. 154(b), the term of this patent shall be extended for 0 days.

(21) Appl. No.: 09/264,979

(22) Filed: Mar. 9, 1999

(51) Int. Cl.$^7$ .................................................... G03F 7/095
(52) U.S. Cl. .................... 430/302; 430/270.1; 430/627; 430/909; 430/910
(58) Field of Search ............................... 430/302, 270.1, 430/502, 627, 909, 910

(56) References Cited

U.S. PATENT DOCUMENTS

| | | | |
|---|---|---|---|
| 3,567,445 | 3/1971 | Atkinson et al. | 96/33 |
| 3,635,709 | 1/1972 | Kobayashi | 96/33 |
| 4,283,478 | 8/1981 | Kubotera et al. | 430/156 |
| 4,299,912 | * 11/1981 | Shiba et al. | 430/302 |
| 4,326,018 | 4/1982 | Jargiello | 430/15 |
| 4,341,856 | 7/1982 | Toyama et al. | 420/156 |
| 4,348,471 | 9/1982 | Shelnut et al. | 430/165 |
| 4,350,753 | 9/1982 | Shelnut et al. | 430/190 |
| 4,447,512 | 5/1984 | Rowe et al. | 430/17 |
| 4,483,758 | 11/1984 | Rowe et al. | 204/159.14 |
| 4,758,497 | 7/1988 | Shah et al. | 430/193 |
| 4,842,988 | * 6/1989 | Herrmann et al. | 430/14 |
| 5,330,875 | 7/1994 | Adelman et al. | 430/142 |
| 5,512,420 | 4/1996 | Hallman et al. | 430/303 |
| 5,609,981 | 3/1997 | Hallman et al. | 430/166 |

FOREIGN PATENT DOCUMENTS 1227603  4/1971  (GB) .

OTHER PUBLICATIONS

"Photoreactive Polymers. The Science and Technology of Resists". By Arnost Reiser. Institute of Imaging Sciences. Chapter 5: Positive Resists Based on Diazonaphthoquinones. pp. 178–225. 1989.

* cited by examiner

Primary Examiner—Janet Baxter
Assistant Examiner—Amanda C. Walke
(74) Attorney, Agent, or Firm—Ratner & Prestia

(57) ABSTRACT

A radiation sensitive plate structure and method for digitally producing a lithographic printing plate. The radiation sensitive plate structure comprises a substrate, a photosensitive layer which changes solubility in a developer liquid upon exposure to actinic radiation, and a photographic layer. The photographic layer comprises a silver halide emulsion dispersed in gelatin, a sensitizing dye, and an adhesion promoting component comprising a vinyl phenol copolymer and a polymeric keying agent. The method for digitally producing a lithographic printing plate comprises the following steps. The radiation sensitive plate structure is provided and the photographic layer is image-wise exposed to visible or laser radiation to form an exposed photographic layer. The exposed photographic layer is developed to form an opaque image mask. Areas of the photosensitive layer not covered by the opaque image mask are uniformly exposed to actinic radiation to effect a solubility change in the developer liquid to form complimentary soluble portions and insoluble portions in the photosensitive layer. The photosensitive layer is developed by treatment with the developer liquid to remove the soluble portions from the photosensitive layer, forming the lithographic printing plate.

23 Claims, No Drawings

DIGITAL LITHOGRAPHIC PRINTING PLATE AND METHOD OF MAKING THEREOF

TECHNICAL FIELD

This invention relates to a radiation sensitive plate structure and a method for digitally producing a lithographic printing plate.

BACKGROUND OF THE INVENTION

Conventional photosensitive lithographic printing plate precursors comprise a support having a hydrophilic surface, such as an aluminum plate, having thereon a non-silver halide photosensitive layer, such as a photosensitive layer comprising an o-quinonediazide compound, and a photographic layer comprising a silver halide emulsion. Such a photosensitive lithographic printing precursor is described in, for example, U.S. Pat. No. 4,283,478.

The conventional plate making process for producing lithographic printing plates from such photosensitive lithographic printing plate precursors comprises four principal steps. First, the photographic layer is imagewise exposed to light and developed to form a silver image in the photographic layer. In the second step, the plate precursor is exposed to UV radiation, wherein the silver image formed in the photographic layer partially masks radiation to the underlying photosensitive layer, therein exposing only a portion of the photosensitive layer. In the third step, the photographic layer, which contains the silver image, is removed. Lastly, in the fourth step, the photosensitive layer is developed.

In this plate making process, it is necessary for the photographic layer, containing the silver image, to be firmly adhered to the photosensitive layer during the second step. In step two, the silver image formed in the photographic layer masks a portion of the underlying photosensitive layer as it is exposed to UV radiation. Following this second exposure, it is necessary to easily remove the photographic layer from the photosensitive layer, as recited in step three.

Considerable effort has been applied in the industry towards the development of lithographic printing plates that provide sufficient adherence of the photographic layer to the photosensitive layer during the course of development. Positive-acting non-silver photosensitive lithographic printing plates providing high pre-development image visibility by including phenolic-novolak resin are described in U.S. Pat. Nos. 4,350,753; 4,348,471; and 4,283,478. U.S. Pat. No. 3,635,709 teaches a positive-working lithographic printing plate wherein the photographic layer contains an ester of 2-diazo-1-naphthol-4(or 5) sulfonic acid with a polyhydroxy phenol. U.S. Pat. No. 3,567,445 describes a presensitized lithographic plate with two differentially spectrally sensitized layers separated by a novolak resin. The base layer is of the type used in the negative-working presensitized lithographic plate and the top layer is a photographic layer.

U.S. Pat. Nos. 5,512,420 and 5,609,981 teach processes for producing waterless lithographic printing plates comprising an aluminum substrate with a first photopolymerizable layer, a second layer of silicone rubber, a third protective film layer, and a fourth photographic layer consisting of a laser scanner silver halide emulsion with polymeric binder. The composition of the plate lends itself to the integration and implementation of digital imaging devices for printable image formation on the plate. U.S. Pat. No. 5,330,875 discloses a process for producing negative and positive original images on a bilevel printing plate containing a photosensitive layer and a silver halide overlayer. The plate utilizes a contact speed (positive or negative) layer and a camera speed (negative) overlayer in a single development process to produce a temporary image mask which is exposed sequentially to either the negative or positive original, with the resultant image subsequently developable in a single process. The camera speed overlayer comprises an Argon laser scanner sensitive silver halide emulsion coating to form a temporary mask.

While advances have been made in the manufacture of printing plate precursors, a serious problem continues to be encountered in daily operation of the plate making for the press. When the disclosed plates are subjected to cut or trim, the photographic layer is frequently damaged at the edge by mechanical shearing applied by a cutting knife. This results in the peeling off and picking off of the photographic layer from the photosensitive layer. Such mechanical damage induces imperfect images due to imperfect masking from the damaged photographic layer.

Therefore, there remains a need for improved adhesion of the photographic layer to the photosensitive layer. In addition, high resistance of the dry photographic layer to mechanical shearing, due to the cutting or trimming of the plate, is highly demanded; while at the same time, adequate wet adhesion of the photographic layer to the photosensitive layer has to be attained in order to eliminate imperfection or damage of the photographic layer due to peel-off or pick-off of the photographic layer in the course of photographic development.

SUMMARY OF THE INVENTION

These needs are met by a radiation sensitive plate structure of this invention comprising in the order given:
(a) a substrate;
(b) a photosensitive layer which changes solubility in a developer liquid upon exposure to actinic radiation; and
(c) a photographic layer comprising:
  (1) a silver halide emulsion dispersed in gelatin;
  (2) a sensitizing dye; and
  (3) an adhesion promoting component comprising a vinyl phenol copolymer and a polymeric keying agent.

Preferably, the vinyl phenol copolymer, is a vinyl phenol/alkyl acrylate copolymer.

An added embodiment of this invention is a method for digitally producing a lithographic printing plate comprising:
(A) providing a radiation sensitive plate comprising in the order given:
  (a) a substrate;
  (b) a photosensitive layer which changes solubility in a developer liquid upon exposure to actinic radiation; and
  (c) a photographic layer comprising:
    (1) a silver halide emulsion dispersed in gelatin;
    (2) a sensitizing dye; and
    (3) an adhesion promoting component comprising a vinyl phenol/alkyl acrylate copolymer;
(B) image-wise exposing the photographic layer to visible or laser radiation to form an exposed photographic layer;
(C) developing the exposed photographic layer to form an opaque image mask;
(D) uniformly exposing to actinic radiation areas of the photosensitive layer not covered by the opaque image mask, to effect a solubility change in the developer liquid to form complimentary soluble portions and insoluble portions in the photosensitive layer; and (E) developing the photosensitive layer by treatment with the developer liquid to remove the soluble portions from the photosensitive layer to form the lithographic printing plate.

DETAILED DESCRIPTION OF THE INVENTION

A camera speed lithographic plate precursor composition has been discovered that can be used for the preparation of imaged printing plates using digital imaging devices.

The radiation sensitive plate structure of the invention is comprised of a support having thereon a non-silver halide photosensitive layer and a photographic layer. The photographic layer of the invention comprises a silver halide emulsion dispersed in gelatin, a sensitizing dye, and an adhesion promoting component. The adhesion promoting component of the invention comprises a vinyl phenol/alkyl acrylate copolymer and a polymeric keying agent. It has been discovered that a radiation sensitive plate structure comprising these components enhances the adhesion of the photographic layer to the photosensitive layer during the plate making process, and particularly during the photographic development process.

Composition of the Lithographic Printing Plate

The lithographic printing plate precursor of the invention comprises, in the order given, a substrate, a photosensitive layer, and a photographic layer.

Substrate

Substrates which can be used in this invention are those having the mechanical strength needed to withstand the rigors of the printing process in which it is used. Examples of commonly used substrates in the manufacture of lithographic printing plates include metal plates such as aluminum, composite metal plates, plastic films such as polyethylene terephthalate, paper, and the like. Preferably, the substrate is aluminum, particularly for use in plates having long press life.

The substrate may be treated or sub-coated with a material which provides a hydrophilic character to the substrate surface for use with a fountain solution. For example, an aluminum substrate may be electrochemically treated to provide a grained surface to enhance hydrophilicity of the surface for use with conventional fountain solutions.

The Photosensitive Layer

The foregoing substrates are converted to photochemically presensitized lithographic printing plates by coating the plates with a photosensitive layer which is sensitive to actinic radiation at camera speed. The term "actinic radiation" as used herein is intended to mean radiation, such as ultraviolet (UV) radiation, which induces a chemical change.

The photosensitive layer of the invention is composed of those photosensitive layers conventionally used in preparing radiation sensitive lithographic printing plates. Conventional photosensitive layers are comprised of compositions which are sensitive to actinic radiation, therein forming an ink receptive image surface, e.g., a lipophilic surface. The term "lipophilic" as used herein is intended to mean a surface which receives oily ink and repels water, such as for use in printing in the presence of a fountain solution. Examples of such photosensitive layer components include, without limitation: compositions comprising one or more diazo resins; compositions comprising one or more onapthoquinone-diazide compounds; compositions comprising one or more radiation sensitive azide compounds; compositions comprising one or more polymers containing an alpha, beta unsaturated carbonyl group in the main or side chain thereof; and photopolymerizable compositions comprising one or more addition-polymerizable unsaturated compounds.

As used herein, the photosensitive layer which changes solubility in a developer liquid upon exposure to actinic radiation is meant to include both photosolubilizable (positive-working) and photohardenable (negative-working) photosensitive layers in the lithographic printing plates of this invention.

As used herein, photosolubilizable photosensitive layer is intended to mean any photosensitive layer which is insoluble in a developer liquid and is rendered soluble in the developer liquid upon exposure to actinic radiation. Such photosolubilizable layers typically contain one or more radiation sensitive materials, such as a compound or polymer containing o-napthoquinonediazide groups, which are rendered soluble in an aqueous alkaline solution. Photosolubilizable (positive-working) lithographic printing plates which are useful in preparing the precursor elements of this invention include those disclosed in U.S. Pat. Nos. 4,758,497, 4,326,018, and 4,350,753. Commercially available positive-working lithographic printing plates include Polychrome's T-41, Vector and Virage printing plates, available from Kodak Polychrome Graphics, Norwalk, Conn.

As used herein, photohardenable photosensitive layer is intended to mean any photosensitive layer which is soluble in the developer liquid and is rendered insoluble in the developer liquid upon exposure to actinic radiation. The term "photohardenable" as used herein is intended to have its conventional meaning as including "photopolymerizable", "photocrosslinkable", "photodimerizable", and combinations thereof. Such photohardenable layers typically contain one or more radiation sensitive materials which are polymerized, crosslinked and/or dimerized to produce a polymeric layer which is insoluble in the developer liquid. Examples of such photohardenable materials which are insolubilized by UV radiation exposure include addition polymerizable, unsaturated monomers and oligomers, e.g., acrylates, methacrylates, etc.; polyvinylcinnamates; vinyl polymers containing aromatic azide groups; and the like. Photohardenable (negative-working) lithographic printing plates which are useful in preparing the precursor elements of this invention include those disclosed in U.S. Pat. Nos. 4,447,512 and 4,483,758. Commercially available negative-working lithographic printing plates of this type include Polychrome's Vistar M and Winner T-71 and T-73 printing plates, available from Kodak Polychrome Graphics, Norwalk, Conn.

Photographic Layer

The photographic layer of the lithographic plate precursor comprises a silver halide emulsion dispersed in gelatin, a sensitizing dye, and an adhesion promoting component, as well as other conventional added components such as nonionic, anionic, and amphoteric surfactants, including alkylphenoxyethylene ethanol, alkylbenzensodium sulfonate, and amino acids.

Silver halide emulsions are extensively utilized in the art and are typically selected from silver chloride, silver bromide, silver iodide, and mixtures thereof. The average silver halide grain diameter is between $0.01\mu$ and $5\mu$. In order to provide a suitable sensitivity to the silver halide, the grains thereof can be subjected to chemical sensitization. Examples of suitable chemical sensitization include sulfur sensitization, reduction sensitization, sensitization using salts of noble metals such as Ir, Rh, Pt, etc., and spectral sensitization using sensitizing dyes. In the present invention, laser scanner negative silver halide emulsion containing sensitizing dyes sensitive to frequency doubled YAG laser ($\lambda_{max}$ 532 nm), Argon laser ($\lambda_{max}$ 488 nm), and red laser ($\lambda_{max}$ 670 nm and 633 nm) emulsion are used. Silver halides of the latent surface image type and inner latent image type can also be used. The silver emulsion generally contains various additives as known in the art. The photographic layer is provided so that the dry weight is about 2 to 10 grams per square meter (g/m$^2$), preferably from 4 to 8 g/m$^2$.

Given the insufficiency of silver halide emulsion adherence to the photosensitive layer, adhesion promoting components are included in the photographic layer. A suitable photographic layer having a silver halide emulsion layer requires good film forming properties and flexibility, but must also remain adhered to the photosensitive layer during storage and preimaging operations. It has been discovered that the combination of a vinyl phenol copolymer with a polymeric keying agent provides good flexibility and film forming properties coupled with greatly improved adhesion of the emulsion layer to the photosensitive layer. Typical vinyl phenol copolymers useful in this invention are copolymers of vinyl phenol and one or more comonomers selected from the group consisting of alkyl acrylates, hydroxyalkyl acrylates, vinyl alkylethers, styrene, maleic anhydride, and alkyl maleate esters. Examples of such copolymers include a copolymer of vinyl phenol/butyl acrylate (Tg=30–100°, Mwt.=10,000–30,000), vinyl phenol/methyl methacrylate (Tg=180° C. Mwt.=8000–12,000), vinyl phenol hydroxyethyl methacrylate (Tg=175° C., Mwt.=7000–14,000), vinyl phenol/styrene (Tg=120–145° C., Mwt.=2500–10,000), vinyl phenol/maleic anhydride, and vinyl phenol/fumaric acid. Preferably, the photographic layer of this invention contains an adhesion promoting component which comprises a vinyl phenol/alkyl acrylate copolymer and a polymeric keying agent. More preferably the alkyl group of the vinyl phenol/alkyl acrylate copolymer is a C$_3$ to C$_7$ alkyl group. Still more preferably, the vinyl phenol/alkyl acrylate copolymer is a copolymer of vinyl phenol and n-butyl acrylate. An example of such a copolymer is vinyl phenol/ n-butyl acrylate, available as Maruka Lyncur CBA resin (Maruzen Chemical Co., Tokyo, Japan).

The preferred vinyl phenol copolymers are used in an amount of from about 2 to about 20 weight percent, based on the solid gelatin amount in the silver halide emulsion. In a preferred embodiment, the vinyl phenol copolymers are 2 to 10 weight percent based on the solid gelatin amount in the silver halide emulsion.

In addition to the vinyl phenol copolymer, the adhesion promoting component of the present invention further comprises a polymeric keying agent. Suitable polymeric keying agents include water-borne latex emulsions such as Duroflex 38-86-66 (42% solids, acrylic-urethane resin, Tg=15° C., National Starch and Chemical Co., Bridgewater, N.J.), vinyl acetate/ethylene copolymers such as Duroflex 5030 (52% solids, National Starch and Chemical Co.), Duroflex 5036 (52% solids, Tg=−12° C., National Starch and Chemical Co.), Airflex 500 (55% solids, Tg=5° C., Air Products and Chemicals Inc. Allentown, Pa.), Airflex 465 (66% solids, Tg=−5° C., Air Products and Chemicals Inc.), Airflex 426 (62% solids, Tg=0° C., Air Products and Chemicals Inc.), ethylene/vinyl chloride copolymer under the trade name of Airflex 430 (52% solids, Tg=0° C., Air Products and Chemicals Inc.), and vinyl acetate/vinyl chloride/ethylene terpolymer under the trade name of Airflex 728 (52% solids, Tg=0° C., Air Products and Chemicals Inc.). Preferably the polymeric keying agent is a water-borne latex emulsion such as a latex emulsion containing a polymeric material selected from the group consisting of a poly(vinyl acetate/ethylene), a poly(ethylene/vinyl chloride), a poly(vinyl acetate/vinyl chloride/ ethylene), an acrylic-urethane resin, and combinations thereof. The polymeric keying agents are in an amount of from about 10 to about 35 weight percent, based on the solid gelatin amount in the silver halide emulsion. In a preferred embodiment, the polymeric keying agents are 5 to 30 weight percent based on the solid gelatin amount in the silver halide emulsion weight.

The adhesion promoting component used in this invention can optionally contain a second keying agent. A second keying agent of this type preferably is a novolak resin.

Method for Producing a Lithographic Printing Plate

A method for digitally producing a lithographic printing plate has also been discovered. First, a radiation sensitive plate is provided. The radiation sensitive plates comprises a substrate, a photosensitive layer which changes solubility in a developer liquid upon exposure to actinic radiation, and a photographic layer. The photographic layer comprises a silver halide emulsion dispersed in gelatin, a sensitizing dye, and an adhesion promoting component comprising a vinyl phenol/n-butyl acrylate copolymer as described above.

After forming the radiation sensitive plate, the second step of this process comprises image-wise exposing the photographic layer to visible radiation to form an exposed photographic layer. Preferably, the photographic layer is image-wise exposed to a beam of laser radiation having an intensity, by directing the beam at sequential areas of the masking layer and modulating the intensity of the beam. Preferably, the beam is a visible laser beam. Following this step, the exposed photographic layer is developed to form an opaque image mask. Next, areas of the photosensitive layer not covered by the opaque image mask are uniformly exposed to actinic radiation, such as UV radiation to effect a solubility change in the photosensitive layer, therein forming complimentary soluble portions and insoluble portions in the photosensitive layer. Any conventional source of actinic radiation may be used to effect exposure of the photosensitive layer. Typical sources contained in commercial exposure units, include mercury arc lamps, xenon arc lamps, fluorescent lamps, and the like. The UV light exposed photosensitive layer is then developed by treatment with a developer liquid to remove the soluble portions from the photosensitive layer, thus forming the lithographic printing plate. The developer liquid may be any solvent or solution which will selectively remove the soluble portions of the imaged photosensitive layer without substantially affecting the insoluble portions thereof. When the imaged photosensitive layer contains image portions having acid functionality, as with exposed areas of photosolubilizable layers containing o-quinonediazide functionality, an aqueous alkaline solution may be used to remove exposed image portions. Alternatively, an organic solvent may be used to remove unexposed portions of an imaged photohardenable layer. Such aqueous, semi-aqueous, and solvent developers are well known in the art and are commercially available. When the photosensitive layer is insoluble in the developer liquid, the portions of the photosensitive layer not covered by the opaque image mask which were exposed to the actinic radiation are soluble in the developer liquid; and the soluble portions of the photosensitive layer are removed from the substrate during development with the developer liquid. After exposure to actinic radiation, and either before, during or after development with the developer liquid, the opaque image mask typically is removed from the insoluble image portions of the photosensitive layer to form the ink receptive surface. Alternatively, when the photosensitive layer is soluble in the developer liquid, the portions of the photosensitive layer not covered by the opaque image mask which were exposed to the actinic radiation are insoluble in the developer liquid, and the opaque image mask and the soluble portions of the photosensitive layer are removed from the substrate during development with the developer liquid.

The term "camera speed" as used herein is intended to describe the layers as sufficiently fast, i.e. photographically light sensitive, to be used in a camera such as a process camera. The camera speed photographic layer in the invention has exposure speeds between 0.5 and 50 $\mu J/cm^2$, and preferably between 0.75 and 30 $\mu J/cm^2$.

The UV light exposure speed of the photosensitive layer in the present invention is between 100 and 800 $mJ/cm^2$, preferably 100 to 400 $mJ/cm^2$.

The lithographic printing plate precursor of this invention will now be illustrated by the following examples but is not intended to be limited thereby.

COMPARATIVE EXAMPLE

A conventional positive working plate (Polychrome T-41) was overcoated with a blue laser scanner negative silver halide emulsion (Polychrome MBS), containing sensitizing dye for frequency doubled YAG laser exposure ($\lambda_{max}$ 532 nm). The plate was dried and the weight of the dried emulsion layer was 6 $g/m^2$. The adhesion of the dry emulsion layer to the non-silver photosensitive layer was evaluated using the cross hatch test, which is described as follows. First, the emulsion layer was cross hatched with a razor blade and taped with transparent tape. Next, the taped area was peeled off to determine the degree of adhesion of the dry emulsion layer to non-silver photosensitive layer. The whole taped area of the emulsion layer was peeled from the photosensitive layer. This is indicative of very poor dry adhesion of the laser scanner silver halide emulsion layer to the non-silver photosensitive layer.

A novolak resin (Alnoval PN-430, American Hoechst, Somerville, N.J.) was dissolved in an organic solvent mixture of ethyl acetate (7 parts) and methyl ethyl ketone (3 parts) and the resultant solution was dispersed in the laser scanner negative silver halide emulsion (Polychrome MBS) by vigorous stirring at 30–40° C. The amount of novolak resin in weight percent was 2–20% based on gelatin. The resulting solution was coated on a conventional positive working plate (Polychrome T-41) and dried by conventional methods. The weight of the dry emulsion layer was 6 $g/m^2$. The adhesion of the dry emulsion layer to the non-silver photosensitive layer was determined using the cross hatch adhesion test. About 80–90% of the dry emulsion layer was peeled from the non-silver photosensitive layer.

Next, a sample of the plate was digitally exposed at 5 $\mu j/cm^2$ on a CREO platesetter 3244-frequency doubled YAG laser ($\lambda_{max}$ 532 nm) scanner to form a latent image. The plate was then processed in a rapid access developer (Polychrome PC 126) and fixed (Polychrome PF 200 fixer) to form a silver image on the laser scanner emulsion layer. The plate was then exposed to actinic ultraviolet radiation at 400 $mJ/cm^2$. Damage to the emulsion layer, such as pick-off and peel-off of the emulsion layer from the non-silver photosensitive layer during processing, was observed, causing imperfections to the positive image on the printing plate. The silver halide emulsion layer was removed from the underlying exposed photosensitive layer in water and processed in Polychrome's positive developer 3000 and gum 963 to render a positive image on the printing plate.

EXAMPLE 1

Polychrome's positive working plate T-41 was overcoated with Polychrome's laser scanner negative silver halide (MBS) emulsion coating solution containing sensitizing dye sensitive to frequency doubled YAG laser scanning ($\lambda_{max}$ 532 nm) and adhesion promoting elements. The laser scanner negative silver halide emulsion coating solution contains, expressed in weight of solids based on gelatin, 20% of Airflex 500 (55% solids, water borne latex emulsion of vinyl acetate/ethylene copolymer, Tg=5° C., Air Products and Chemicals, Inc.) and 4% of Alnovol PN-430 novolak resin and 4% of Maruka Lyncur CBA resin (vinyl phenol/n-butylate copolymer, Maruzen Chemical Co.). The Lyncur CBA and novolak resins were dissolved in a mixture of ethyl acetate and methyl ethylketone (MEK), and were dispersed into laser scanner negative silver halide emulsion by vigorous stirring at 30–40° C. Into the resultant dispersion, Airflex 500 was finely dispersed with vigorous stirring. The plate was coated and dried by conventional methods. The laser scanner negative silver halide emulsion layer had a dry weight of 6 $g/m^2$.

The cross hatch adhesion test of the dried silver halide emulsion layer to the non-silver photosensitive layer resulted in 0–25% peel-off of the emulsion layer from the non-silver photosensitive layer, which is indicative of excellent adhesion of the dry emulsion layer to the non-silver photosensitive layer.

Next, the plate was digitally exposed at 5 $\mu J/cm^2$ exposure using a CREO platesetter 3244, and processed in a rapid access developer (Polychrome PC 126) and fixed (Polychrome PF 200 fixer) to form a silver image on the laser scanner emulsion layer, which exhibited excellent adhesion of the wet silver halide emulsion layer to the non-silver photosensitive layer. The plate was then given an overall UV exposure of 400 $mJ/cm^2$ to expose the non-silver halide photosensitive layer. After removal of the silver halide emulsion layer in water, the plate was developed using Polychrome's positive developer 3000. The plate rendered an excellent positive image of (98/2)%-dot resolution without imperfection in the imaged area.

EXAMPLE 2

Polychrome's negative working Winner T-71 plate was overcoated with Polychrome's laser scanner negative silver halide (MBS) emulsion coating solution in the same manner as described in Example 1 to provide a dry emulsion layer weight of 6 $g/m^2$. The cross hatch adhesion test of the dried emulsion layer showed excellent dry adhesion. The plate was exposed at 5 $\mu J/cm^2$ exposure using a CREO platesetter 3244, developed, and fixed in the same manner as described above, and given an overall UV exposure at 300 $mJ/cm^2$. After removal of the silver halide emulsion layer in water, the plate was developed using Polychrome's T-112-5 negative plate developer. The plate exhibited an excellent positive image of (98/2)%-dot resolution.

EXAMPLE 3

A laser scanner negative silver halide (MBS) emulsion containing sensitizing dye sensitive to frequency-doubled YAG laser exposure ($\lambda_{max}$ 532 nm) was dispersed with 21% of Airflex 728 (52% solids, water borne latex of vinyl acetate/vinyl chloride/ethylene terpolymer, Tg=0° C., Air Products and Chemicals, Inc.) and 4% of Lyncur CBA resin. The resultant emulsion was coated over a positive working T-41 plate. The dry weight of the silver halide emulsion layer after drying was 6 $g/m^2$.

The adhesion test of the dried emulsion layer to the non-silver photosensitive layer was measured using the cross hatch adhesion test, as described in the Comparative Example. Excellent dry and wet adhesion of the emulsion layer to the non-silver photosensitive layer were obtained.

Next, the plate was digitally exposed and processed as in the Comparative Example to render a positive image of (98/2)%-dot resolution without any imperfection on the imaged area.

EXAMPLE 4

Polychrome's positive working plate T41 was overcoated with Polychrome's laser scanner negative silver halide emulsion (MBS) coating solution containing sensitizing dye sensitive to frequency doubled YAG laser exposure ($\lambda_{max}$ 532 nm) and adhesion enhancement elements.

The laser scanner negative silver halide emulsion layer contained, expressed in weight of solids based on gelatin, 10–30% of Duroflex 38-86-66 (42% solids, acrylic-urethane resin water borne latex emulsion, National Starch and Chemical Co.), 2.5–5% of Maruka Lyncur CBA resin (vinyl phenol/n-butyl acrylate copolymer, Maruzen Chemical Co.), and 15–30% of novolak resin (Alnoval PN-430, American Hoechst).

Lyncur CBA and novolak resins were dissolved in an organic solvent (7 parts ethyl acetate/3 parts methyl ethyl ketone), and dispersed in the laser scanner negative silver halide emulsion layer containing sensitizing dye with vigorous stirring at 30–40° C., and subsequently Duroflex 38-86-66 was added to the dispersion. The plate was coated and dried by conventional methods. The laser scanner negative silver halide emulsion layer had a dry weight of 6 g/m².

The adhesion of the dried emulsion layer to the non-silver photosensitive layer was measured using the cross hatch adhesion test, as described in the Comparative Example. Peel-off of 0–25% of the emulsion layer from the non-silver photosensitive layer was observed. This is indicative of excellent dry adhesion of emulsion layer similar to the results obtained in Example 1.

Next, the plate was digitally exposed at 5 $\mu$J/cm² on a CREO platesetter 3244-frequency doubled YAG laser ($\lambda_{max}$ 532 nm) scanner to form a latent image. The plate was then processed in a rapid access developer (Polychrome PC-126) and Polychrome PF 200 fixer to form a silver image on the laser scanner negative silver halide emulsion layer. The plate was then given an overall exposure of actinic (UV) light of 400 mJ/cm². No peel-off and pick-off of the emulsion layer at the cut edge of the plate and on imaged area were observed. The adhesion test results were similar to that from a trimmed plate using a guillotine cutter.

These results demonstrate that the addition of Duroflex 38-86-66 and Lyncur CBA to the silver halide emulsion layer greatly enhanced adhesion of dry and wet emulsion layers to the non-silver photosensitive layer. Similarly, additions of Lyncur CBA resin in combination with water borne latex emulsions of vinyl acetate-ethylene copolymer (Example 1) and vinyl acetate-vinyl chloride-ethylene terpolymer (Example 3) to the laser scanner negative silver halide emulsion enhanced dry and wet adhesion of the laser scanner emulsion layer to the non-silver halide photosensitive layer.

The silver halide emulsion layer, after overall UV exposure, was removed in water and processed in the same manner as above. The plate exhibited excellent image revealing resolution of (2/98)%-dot, and was run on a press to produce over one million copies after baking.

EXAMPLE 5

Polychrome's positive working plate T-41 was overcoated with Polychrome's red laser diode scanner negative silver halide emulsion (RLD 450 or 850) containing sensitizing dye ($\lambda_{max}$ 633 and 670 nm) and adhesion enhancement elements.

The red laser diode scanner negative silver halide emulsion contains, expressed in weight of solids based on gelatin, 10–30% of Duroflex 38-86-66 (42% solids, acrylic-urethane resin water borne latex emulsion, National Starch and Chemical Co.), 2.5–5% of Maruka Lyncur CBA resin (vinyl phenol/n-butyl acrylate copolymer, Maruzen Chemical Co.), and 15–30% of novolak resin (Alnoval PN-430, American Hoechst). The plate was coated and dried by conventional methods. The weight of the dry silver halide emulsion layer was 5 g/m².

The plate exhibited excellent adhesion of the dry emulsion layer to the non-silver photosensitive layer, which was tested using the cross hatch adhesion test, described in the Comparative Example, and excellent wet adhesion of the emulsion layer to the non-silver photosensitive layer.

The plate was digitally exposed at 1.5 $\mu$J/cm² for 2540 DPI (dot per inch) resolution on a Gerber Crescent C-68 platesetter to form a latent image. The plate was then processed in a rapid access developer (Polychrome PC126) and Polychrome PF200 fixer to form a silver image in the emulsion layer. The plate was then given an overall exposure of actinic (UV) light of 400 mJ/cm². No pick-off or peel-off of the wet emulsion layer was observed.

The laser scanner silver halide emulsion layer was then removed in water and processed in Polychrome's positive developer 3000 and gum 963. The plate exhibited an excellent positive image on the printing plate. The plate could be run on a press for about 1.5 million impressions.

Those skilled in the art having the benefit of the teachings of the present invention as hereinabove set forth, can effect numerous modifications thereto. These modifications are to be construed as being encompassed within the scope of the present invention as set forth in the appended claims.

What is claimed is:

1. A radiation sensitive plate structure comprising in the order given:
    (a) a substrate;
    (b) a photosensitive layer which changes solubility in a developer liquid upon exposure to actinic radiation; and
    (c) a photographic layer comprising:
        (1) a silver halide emulsion dispersed in gelatin;
        (2) a sensitizing dye; and
        (3) an adhesion promoting component comprising a vinyl phenol copolymer and a polymeric keying agent;
    wherein the photographic layer comprises about 2 to about 20 weight percent of the vinyl phenol copolymer, based on the amount of solid gelatin in the photographic layer, and about 5 to about 35 weight percent of the polymeric keying agent, based on the amount of solid gelatin in the photographic layer.

2. The radiation sensitive plate structure of claim 1 wherein the substrate has a hydrophilic surface which is contiguous to the photosensitive layer.

3. The radiation sensitive plate structure of claim 1 wherein the substrate is an aluminum plate.

4. The radiation sensitive plate structure of claim 1 wherein the photosensitive layer has an ink receptive surface.

5. The radiation sensitive plate structure of claim 1 wherein the photosensitive layer is soluble in the developer liquid and is rendered insoluble in the developer liquid upon exposure to actinic radiation.

6. The radiation sensitive plate structure of claim 1 wherein the photosensitive layer is insoluble in the developer liquid and is rendered soluble in the developer liquid upon exposure to actinic radiation.

7. The radiation sensitive plate structure of claim 1 wherein the actinic radiation is ultraviolet radiation.

8. The radiation sensitive plate structure of claim 1 wherein the sensitizing dye is sensitive to visible laser radiation.

9. The radiation sensitive plate structure of claim 1 wherein the vinyl phenol copolymer is a vinyl phenol/alkyl acrylate copolymer.

10. The radiation sensitive plate structure of claim 9 wherein the vinyl phenol/alkyl acrylate copolymer comprises at least one monomer selected from the group consisting of alkyl acrylates, alkyl methacrylates, hydroxyalkyl acrylates and, hydroxyalkyl methacrylates.

11. The radiation sensitive plate structure of claim 10 wherein the alkyl group of the vinyl phenol/alkyl acrylate copolymer has three to seven carbon atoms.

12. The radiation sensitive plate structure of claim 11 wherein the vinyl phenol/alkyl acrylate copolymer is a vinyl phenol/n-butyl acrylate copolymer.

13. The radiation sensitive plate structure of claim 1 wherein the polymeric keying agent is a water-borne latex emulsion.

14. The radiation sensitive plate structure of claim 13 wherein the water-borne latex emulsion comprises a polymeric material selected from the group consisting of poly(vinyl acetate/ethylene) copolymers, poly(ethylene/vinyl chloride) copolymers, poly (vinyl acetate/vinyl chloride/ethylene) copolymers, acrylic-urethane resins, and combinations thereof.

15. The radiation sensitive plate structure of claim 1 wherein the photographic layer further comprises a novolak resin.

16. The radiation sensitive plate structure of claim 14 wherein the vinyl phenol copolymer is a vinyl phenol/alkyl acrylate copolymer.

17. The radiation sensitive plate structure of claim 16 wherein the vinyl phenol/alkyl acrylate copolymer consists essentially of vinyl phenol and at least one comonomer selected from the group consisting of alkyl acrylates, alkyl methacrylates, hydroxyalkyl acrylates, and hydroxyalkyl methacrylates.

18. The radiation sensitive plate structure of claim 17 wherein the alkyl group of the vinyl phenol/alkyl acrylate copolymer has three to seven carbon atoms.

19. The radiation sensitive plate structure of claim 10 wherein the polymeric keying agent is a waterborne latex emulsion comprising a polymeric material selected from the group consisting of poly(vinyl acetate/ethylene) copolymers, poly(ethylene/vinyl chloride) copolymers, poly (vinyl acetate/vinyl chloride/ethylene) copolymers, acrylic-urethane resins, and combinations thereof.

20. The radiation sensitive plate structure of claim 18 wherein photographic layer comprises about 2 to about 10 weight percent of the vinyl phenol copolymer, based on the amount of solid gelatin in the photographic layer, and about 10 to about 30 weight percent of the polymeric keying agent, based on the amount of solid gelatin in the photographic layer.

21. The radiation sensitive plate structure of claim 20 wherein the vinyl phenol/alkyl acrylate copolymer is a vinyl phenol/n-butyl acrylate copolymer.

22. The radiation sensitive plate structure of claim 20 wherein the photographic layer further comprises a novolak resin.

23. The radiation sensitive plate structure of claim 1 wherein photographic layer comprises about 2 to about 10 weight percent of the vinyl phenol copolymer, based on the amount of solid gelatin in the photographic layer, and about 10 to about 30 weight percent of the polymeric keying agent, based on the amount of solid gelatin in the photographic layer.

* * * * *